(12) United States Patent
Cangemi et al.

(10) Patent No.: US 8,399,110 B2
(45) Date of Patent: Mar. 19, 2013

(54) ADHESIVE, HERMETIC OXIDE FILMS FOR METAL FLUORIDE OPTICS AND METHOD OF MAKING SAME

(75) Inventors: Michael J Cangemi, Victor, NY (US); Horst Schreiber, Rochester, NY (US); Jue Wang, Fairport, NY (US)

(73) Assignee: Corning Incorporated, Corning, NY (US)

( * ) Notice: Subject to any disclaimer, the term of this patent is extended or adjusted under 35 U.S.C. 154(b) by 1145 days.

(21) Appl. No.: 12/156,429

(22) Filed: May 29, 2008

(65) Prior Publication Data

US 2009/0297812 A1    Dec. 3, 2009

(51) Int. Cl.
*B32B 15/04* (2006.01)
*C23C 14/06* (2006.01)

(52) U.S. Cl. ........ 428/702; 428/689; 428/699; 428/701; 428/410; 204/192.1; 204/192.11

(58) Field of Classification Search .................. 428/220, 428/447, 696, 702, 688, 689, 699, 701, 410; 427/579, 576, 569; 204/192.1, 192.11
See application file for complete search history.

(56) References Cited

U.S. PATENT DOCUMENTS

| | | | |
|---|---|---|---|
| 7,128,984 B2 | 10/2006 | Maier et al. | 428/696 |
| 7,242,843 B2 | 7/2007 | Clar et al. | 385/147 |
| 2006/0291060 A1 | 12/2006 | Shirai et al. | |
| 2007/0003208 A1* | 1/2007 | Clar et al. | 385/147 |
| 2008/0050910 A1* | 2/2008 | Hart et al. | 438/622 |

OTHER PUBLICATIONS

Gregory Szulczewski and Robert J. Levis, "A theory for calculating the surface-adsorbate bond dissociation energy from collision-induced desorption threshold measurements", J. Chem. Phys. 98 (7), Apr. 1, 1993.*
N K Sahoo et al; "Achieving superior band gap, refractive index and morphology in composite oxide thin film systems violating the Moss rule"; Journal of Physics D: Applied Physics; 39 (2006)2571-2579.
Wang et al; "Extended lifetime of fluoride optics"; Proc. of SPIE; vol. 6720 pp. 67200I-1-67200I-9.
Wang et al; "Elastic and plastic relaxation of densified SiO2 films"; Applied Optics, vol. 47, No. 13; pp. C131-C134.
Karl H. Gunther; "Microstructure of vapor-deposited optical coatings"; Applied Optics, vol. 23, No. 21 (1984) pp. 3806-3816.
Jue Wang et al, "Crystal phase transition of HfO2 films evaporated by plasma-ion-assisted deposition", Applied Optics, vol. 47 No. 13 (2008), pp. C189-C192.
TW098117922 Search Report.

* cited by examiner

*Primary Examiner* — Jennifer McNeil
*Assistant Examiner* — Lauren Golgan
(74) *Attorney, Agent, or Firm* — Walter M. Douglas

(57) ABSTRACT

The invention is directed to single crystal alkaline earth metal fluoride optical elements having an adhesive, hermetic coating thereon, the coating being chemically bonded to the surface of the metal fluoride optical element with a bonding energy $\geq 4$ eV and not merely bonded by van der Walls forces. The materials that can be used for coating the optical elements are selected from the group consisting of $SiO_2$, F—$SiO_2$, $Al_2O_3$, F—$Al_2O_3$, SiON, $HfO_2$, $Si_3N_4$, $TiO_2$ and $ZrO_2$, and mixtures (of any composition) of the foregoing, for example, $SiO_2$; $HfO_2$ and F—$SiO_2/ZrO_2$. The preferred alkali earth metal fluoride used for the optical elements is $CaF_2$. Preferred coatings are $SiO_2$, F—$SiO_2$, $SiO_2/ZrO_2$ and F—$SiO_2/ZrO_2$.

25 Claims, 7 Drawing Sheets

ADHESIVE, HERMETIC OXIDE FILMS FOR METAL FLUORIDE OPTICS AND METHOD OF MAKING SAME

FIELD OF THE INVENTION

The invention is directed to metal fluoride optics having an adhesive, hermetic oxide film thereon and a method for making such films and optics. In particular the invention is directed to alkaline earth metal fluoride optical elements having silica and doped silica films thereon, and a method for making such films using plasma ion assisted deposition ("PIAD").

BACKGROUND

The deposition of thin optical thin films is known in the art and several different methods or technologies have been used to deposit such films. Among the employed that have been applied, all of which are carried out in vacuum, are (1) Conventional Deposition ("CD"), (2) Ion Assisted Deposition ("IAD"), (3) Ion Beam Sputtering ("or IBS"), and (4) Plasma Ion Assisted Deposition ("PIAD").

In the Conventional Deposition (CD) method, the material(s) to be deposited are heated to the molten state by either a resistance heating method or by electron bombardment, the heating being done in the presence of a substrate upon which a film is to be deposited. When molten, evaporation of the material occurs and a film is condensed on the surface of the substrate. At the molten material temperatures used by this method some disassociation of the evaporant takes place. While this dissociation is not a problem when an elemental material is being deposited (for example, elemental aluminum, silver, nickel, etc.), it does present a problem when the material to be deposited is a compound (for example, $SiO_2$, $HfO_2$). In the case of oxide materials, small amounts of oxygen are bled into the chamber during deposition in an attempt to re-store stoichiometry, a so-called reactive deposition. The films that are by the CD method are generally porous and lack sufficient kinetic energy (surface mobility) upon deposition to overcome surface energy (adhesion). Film growth is typically columnar (K. Gunther, *Applied Optics*, Vol. 23 (1984), pp. 3806-3816) with growth in the direction to the source and having a porosity that increases with increasing film thickness. In addition to high film porosity, other problems encountered with CD deposited films include index of refraction inhomogeneity, excessive top surface roughness, and weak absorption. Some improvements, though slight, are possible by adjusting the depositions rate and by increasing the substrate temperature during deposition. However, overall considerations of the final product dictate that CD techniques are not suitable for high quality optical components, for example, telecommunications elements, filters, laser components, and sensors.

Ion Assisted Deposition (IAD) is similar to the CD method described above, with the added feature that the film being deposited is bombarded with energetic ions of an inert gas (for example, argon) during the deposition process, plus some ionized oxygen (which in the case of oxide films is generally necessary to improve film stoichiometry). While ion energies are typically in the range 300 eV to 1000 eV, ion current at the substrate is low, typically a few micro-amps/cm². (IAD is thus a high voltage, low current density process.) The bombardment serves to transfer momentum to the depositing film and to provide sufficient surface mobility so that surface energies are overcome and dense, smooth films are produced. The index inhomogeneity and transparency of the deposited films are also improved and little or no substrate heating is required for the IAD method.

Ion Beam Sputtering (IBS) is a method in which an energetic ion beam (for example, argon ions in the range 500 eV-1500 eV) is directed to a target material, typically an oxide material. The momentum transferred upon impact is sufficient to sputter-off target material to a substrate where it is deposited as a smooth, dense film. Sputtered material arrives at the substrate with high energy, perhaps several hundred electron volts leading to high packing density and smooth surface, but high absorption of the deposited films is a common by-product of the IAB process. As a result, an IBS process might also include an IAD source to both improve stoichiometry and absorption. While the IBS process is an improvement over CD and IAD, there are nonetheless problems with IBS. Such problems with the IBS deposition process include: (1) the deposition process is very slow; (2) it is more of a laboratory technique than a production process; (3) there are few IBS installations in existence, typically remnants from the telecom bubble and having one or two machines operated by a small staff; (4) substrate capacity is quite limited; (5) deposition uniformity over the substrate can become a limitation thus affect product quality and resulting in a high discard rate; (6) as the target is eroded the uniformity of the film being deposited changes, thus resulting in further quality problems and frequent target change-outs with associated down-time and costs; and (7) the bombardment energy is quite high, leading to disassociation of the deposited materials and hence absorption.

Plasma Ion Assisted Deposition (PIAD) is similar to the IAD process above, except momentum is transferred to the depositing film via a low voltage, but high current density plasma. Typical bias voltages are in the range 90-160 v and current densities in the range of milli-amps/cm². While PIAD instruments are common in the precision optics industry and have been used to deposit films, there are some problems with the PIAD method, particularly in regard to the homogeneity of the deposited film. PIAD deposition has been described in commonly owned, copending U.S. application Ser. No. 11/510,140, Jue Wang et al inventors, published as US 2008/0050910 A1.

ArF excimer lasers have been is the illumination source of choice for the microlithography industry and have been used to mass-produce patterned silicon wafers in semiconductor manufacturing. As semiconductor processing has progressed from the 65 nm to the 45 nm node and beyond, microlithography technology has faced challenges in continuing to drive improved resolution, throughput, and stability. As a result, the expectations and requirements for excimer laser components have also increased. Alkaline earth metal fluoride optical crystals ($CaF_2$, $MgF_2$, etc.), especially $CaF_2$, are the preferred optical material for making optical elements for ArF lasers due to their excellent optical properties and high bad gap energies. However, polished, but uncoated $CaF_2$ surfaces degrade after only a few million pulses for fluences above ~40 mJ/cm² at 193 nm. Some solutions have been provided to extend the lifetimes of polished $CaF_2$ components used in connection with excimer laser based systems. These include improved surface finishing quality and vacuum deposition of a thin layer of F-doped $SiO_2$ as has been described in U.S. Pat. Nos. 7,242,843 and 7,128,984. However, the semiconductor industry constantly demands more performance from excimer laser sources, and as a result, excimer laser power and repetition rate over the last several years has been raised from 40 W to 90 W and from 2 KHz to 6 KHz, respectively. The laser power and repetition rate will be further raised to 120 W and 8 KHz according to the technology roadmap of excimer lasers. These increases in power and repetition rate challenge the lifetime of existing laser optics components. As a result of these increases in power and repetition rate there is concern about premature failure of the optics due to bubble formation which has been observed in accelerated laser damage testing, for example using F—$SiO_2$ coated $CaF_2$ optical elements operating at the above higher power and reputation rates. For use in the higher power and repetition rate laser systems the environmental stability of F—$SiO_2$ coated optical elements needs to be improved, especially in high humidity conditions.

Consequently, in view of the higher power and repetition rates that are becoming common in the industry there is a need for either a new process or improvements in the existing processes. In particular, there is a need for a process that can produce smooth and dense film coating on metal fluoride optical element and the elimination of bubble formation when such elements are used in the higher power and repetition rate laser systems.

SUMMARY

The invention is directed to single crystal alkaline earth metal fluoride optical elements having an adhesive, hermetic coating thereon, the coating being chemically bonded to the surface of the alkaline earth metal fluoride optical element with a bond energy $\geq 4$ eV and not merely bonded by van der Walls forces. The materials that can be used for coating the optical elements are selected from the group consisting of $SiO_2$, F—$SiO_2$, $Al_2O_3$, F—$Al_2O_3$, SiON, $HfO_2$, $Si_3N_4$, $TiO_2$ and $ZrO_2$, and mixtures (of any composition) of the foregoing, for example without limitation, $SiO_2$; /$HfO_2$ and F—$SiO_2$/$ZrO_2$. In one embodiment the alkaline earth metal fluoride used for the optical elements is $CaF_2$. In another embodiment the coating material is $SiO_2$ and F—$SiO_2$.

In one embodiment the invention is directed to a method for making adhesive, hermetic coating on alkaline earth metal fluoride optics, the method comprising the steps of providing a vacuum chamber and within said chamber providing an optical element made from a single crystal of an alkaline earth metal fluoride, said element being located on a rotatable plate; providing at least one selected coating material source, or a mixture of coating materials source, and vaporizing said material(s) using an e-beam to provide a coating material vapor flux, said flux passing from said material source by a mask having a selected shape to said optical element; providing plasma ions from a plasma source; rotating said element at a selected rotation frequency f; and depositing said coating material on the surface of said optical element as a coating film and bombarding said film on said element with said plasma ions during said material deposition process to thereby form an adhesive, hermetic film on said element. The film is chemically bonded to the surface of said element with a bonding energy $\geq 4$ eV; said alkaline earth metal fluoride is selected from the group consisting of $MgF_2$, $CaF_2$, $BaF_2$, $SrF_2$; and mixtures of at least two of said alkaline earth metal fluorides; and said mask is selected from the group consisting of a partial mask and a reverse mask. In a preferred embodiment the mask is a partial mask.

The invention is further directed to an optical element having an adhesive, hermetic coating thereon. The optical element is a shaped optical element made of a single crystal alkaline earth metal fluoride material and has a coating chemically bonded to at least one light transmitting surface of said element, the coating being bonded to said element surface with a bond energy $\geq 4$ eV. The alkaline earth metal fluoride single crystal material selected from the group consisting of $MgF_2$, $CaF_2$, $BaF_2$, $SrF_2$, and mixtures of at least two of said alkaline earth metal fluorides. In a preferred embodiment the optical element is made from single crystal $CaF_2$. The coating materials are be selected from the group consisting of $SiO_2$, F—$SiO_2$, $Al_2O_3$, F—$Al_2O_3$, SiON, $HfO_2$, $Si_3N_4$, $TiO_2$ and $ZrO_2$, and mixtures thereof. The thickness of the coating on the optical element is in the range of 20 to 200 nm. In a preferred embodiment the thickness is in the range of 50 to 150 nm. In one embodiment the optical element is a $CaF_2$ optical element. In another embodiment the coating material on the optical element is $SiO_2$ and/or F—$SiO_2$.

DETAILED DESCRIPTION

The invention is directed to improved coated optical elements that can be used in high power, high repetition rate laser systems and to a method for making such optical elements. Examples of such optical elements, without limitation, included lenses, partially and fully reflective mirrors, and windows made of an alkali earth metal fluoride. $CaF_2$ is the preferred metal fluoride for such elements.

Using the method of the invention one is able to prepare optical elements having an adhesive, hermetic coating. The invention is particularly suitable for use in coating and preparing optical elements made from single crystals of alkaline earth metal fluorides, for example $MgF_2$, $CaF_2$, $BaF_2$ and $SrF_2$, and elements made from mixtures of such metal fluorides, for example, $(Ca,Sr)F_2$. The coating materials are selected from the group consisting of $SiO_2$, F—$SiO_2$, $Al_2O_3$, F—$Al_2O_3$, SiON, $HfO_2$, $Si_3N_4$, $TiO_2$, and $ZrO_2$, and mixtures (of any composition) of the foregoing, for example without limitation, $SiO_2/HfO_2$, and $F-SiO_2/ZrO_2$ and $SiO_2/ZrO_2$. Herein $SiO_2$ and $F-SiO_2$ are used as exemplary coating materials, and $CaF_2$ is used as an exemplary optical element/substrate.

The invention as described herein illustrates three factors that are important for reaching the goal of adhesive and hermetic oxide coatings on fluoride optics, especially $CaF_2$ surfaces. These are:

1. Enhanced film adhesion by means of chemical bond formation at the interface of $CaF_2$ crystal substrate and oxide film, instead of van der Waals bond formation. The chemical bonding strength is 100× greater than the van der Waals' forces at the interface of $CaF_2$ substrate and an oxide film, for example without limitation, a $SiO_2$ based film. This results in a film coating that strongly adheres to the surface of the alkaline earth metal fluoride optic (for example, a lens made from single crystal $CaF_2$) and hermetically seals the surface of the crystal.
2. Increased film packing density by increasing plasma momentum transfer.
3. Eliminating coating point defects and improving film smoothness by means of in situ plasma smoothing via masking technology.

Enhanced Film Adhesion

Figure 1:
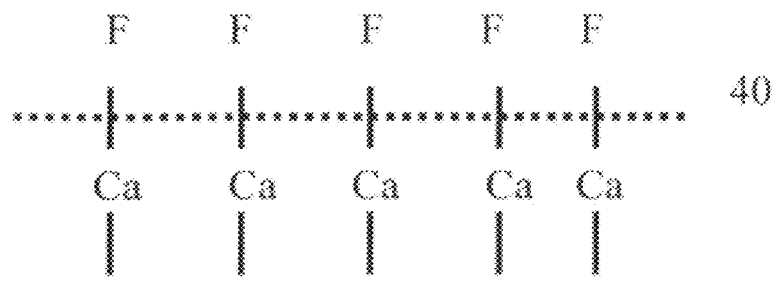
FIG. 1 is a schematic drawing of a $CaF_2$ surface.
Figure 2:
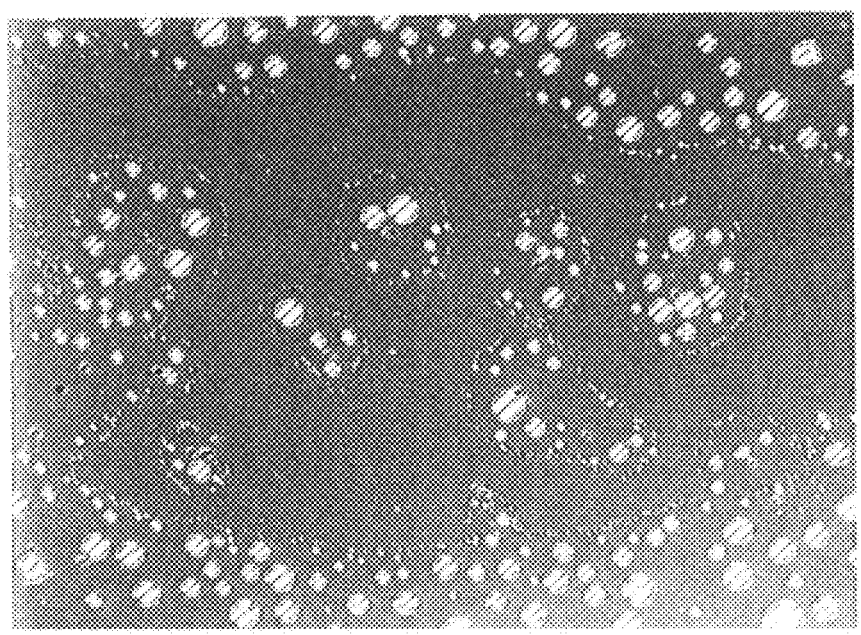
FIG. 2 is an optical image illustrating the premature failure of prior art F—$SiO_2$ coated $CaF_2$ optics as a result of bubble formation after 193 nm laser irradiation of 40M pulses at 70 mJ/cm$^2$ and 3 KHz.
Figure 3:
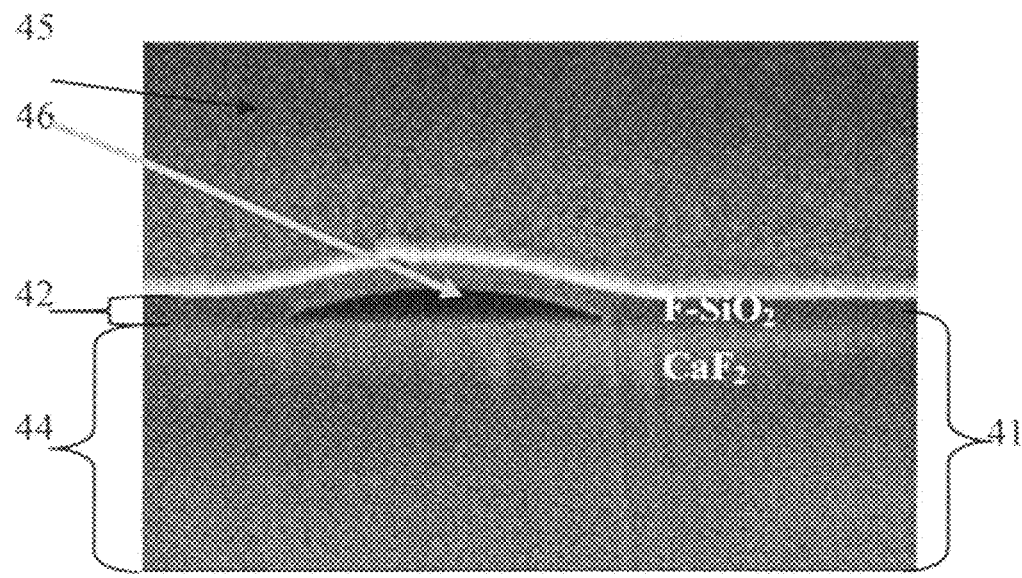
FIG. 3 is a SEM cross-sectional image of premature failure of a prior art F—$SiO_2$ coated $CaF_2$ optic as a result of bubble formation under 193 nm laser irradiation.
Figure 4:
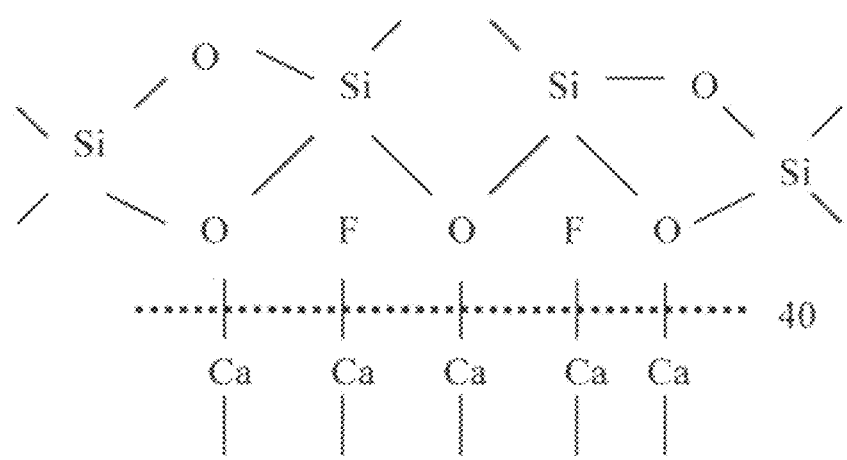
FIG. 4 is a schematic illustration the chemically bonded interface of a $CaF_2$ substrate and a $SiO_2$ film.

FIG. 1 schematically illustrates the surface bonding structure of a $CaF_2$ crystal, the dotted line 40 representing the $CaF_2$ interfacial area at which the deposited film will be located. The mechanism of $SiO_2$ film formation on a $CaF_2$ surface is physical vapor deposition (PVD), in which thermally evaporated $SiO_2$ or $F-SiO_2$ is generated by electron beam irradiation and is transported by a vapor to the $CaF_2$ substrates within a high vacuum environment and physically adsorbed on a $CaF_2$ surface. The interaction between $SiO_2$ film and $CaF_2$ substrate is dominated by the van der Waals force. The estimated van der Waals bonding energy of $SiO_2-CaF_2$ interface is ~0.04 eV, which is very weak if compared to the bonding energy of Ca—O—Si which is >4 eV (2 orders of magnitude greater than the van der Waals bonding energy). The weak interfacial bonding may explain the typical premature failure of bubble formation of the $F-SiO_2$ coated $CaF_2$ optics under 193 nm laser irradiation. As an example, FIG. 2 shows an optical image of the premature failure of $F-SiO_2$ coating $CaF_2$ optics as a result of bubble formation after 40M pulses (million pulses, $10^6$ pulses) at a fluence of 70 mJ/cm$^2$ by using 193 nm laser operating at 3 KHz repetition rate. FIG. 3 shows a SEM cross-sectional image of an $F-SiO_2$ coated element 41 as indicated by the bracket and the bubble 46 (the black hump) that forms as a result of $SiO_2$ film 42 delamination from the $CaF_2$ substrate 44 when the optical element is subjected to the foregoing radiation. The area numbered 45 is background due to the surface on which the coated $CaF_2$ element/substrate 41 was placed and the white line above the $F-SiO_2$ coating is a reflection artifact produced while taking the SEM photograph and is not due to any defect in the coating and/or the substrate. The white line arises is thus reflectivity from the edge of the coated article as it falls off to the background upon which the article rests. In contrast to the bubble formation shown in FIGS. 2 and 3, FIGS. 10 and 11 discussed below illustrate a $CaF_2$ optic coated with an adhesive, hermetic $SiO_2$ film according to the invention which does not show any film failure after 40M pulses at 70 MJ/cm$^2$ and 3 KHz FIG. 4 schematically illustrates the chemically bonded interface 40 of a $SiO_2$ film and a $CaF_2$ substrate, where a significant amount of Ca—O—Si bonds are generated. J. Wang et al reported in "Extended lifetime of fluoride optics", 39$^{th}$ Boulder Damage Symposium, Proc. SPIE, Vol. 6720 672001 (2007) that fluorine atoms can be easily depleted from a $CaF_2$ surface under Ar plasma bombardment. By inserting oxygen gas into Ar plasma, the fluorine vacancy can be occupied by oxygen which has a bridge functionality to chemically connect Ca and Si atoms, leading to strong film adhesion to $CaF_2$ substrates.

Figure 5:
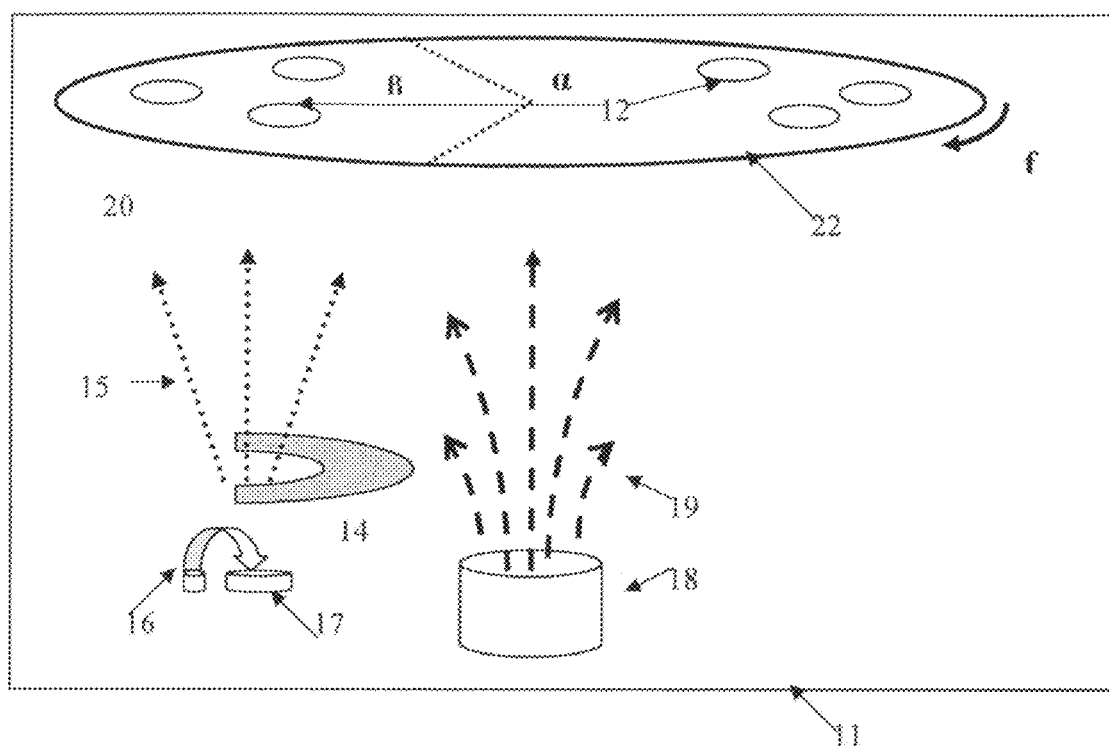
FIG. 5 is a schematic drawing of in situ plasma smoothing during the deposition of a $SiO_2$ film on $CaF_2$ optical elements.

The process of fluorine depletion and oxygen replacement is controlled by means of masking technology as illustrated in FIG. 5 where zone α and β correspond to the mask shadowed and un-shadowed areas, respectively. FIG. 5 illustrates a deposition set-up 20 having a vacuum chamber 11 in which is located a rotatable element holder 22 on which optical elements 12 to be coated are located, e-beam 16 that impinges on a target 17 to produce a vapor flux 15 that passes by the mask 14 for deposition on elements 12. In addition there is a plasma source 18 that generates plasma 19. The rotatable element holder 22 can have openings through the holder element for placements of optical elements 12 so that only one side of the optical element is to be coated. In the early stage of film deposition the plasma bombards the $CaF_2$ substrate surface only in zone α, whereas in zone β the plasma ion interacts with the deposited $SiO_2$ molecules (or $F-SiO_2$). Fluorine depletion and oxygen replacement occur in zone α. In zone β, the Ar/O$_2$ plasma continuously collides with the deposited $SiO_2$ film to form a Ca—O—Si bonding. This coating process with interfacial bonding enhancement can be described by plasma momentum transfer per deposited atom P, which is the sum of momentum transfer in zone α ($P_\alpha$) and zone β ($P_\beta$), in units of (a.u. eV)$^{0.5}$ during coating is, $$P = P_\alpha + P_\beta = \frac{1}{2\pi}\left(\frac{\alpha}{n_s f} + \frac{\beta}{R}\kappa\right)J_i\sqrt{2m_i eV_b} \qquad \text{Eq. (1)}$$

where $V_b$ is the bias voltage; $J_i$ and $m_i$ are the plasma ion flux in ion/(cm$^2$ sec) and mass in a.u., respectively; R is the deposition rate in nm/sec; e is the electron charge; k is a unit conversion factor; $n_s$ is $CaF_2$ surface atom density in atom/cm$^2$; and α and β are the radian of mask shadowed and un-shadowed area of the vapor flux relative to the center of the rotatable plate which is rotated with a frequency f, frequency f being in the range of 4 to 36 rpm. Adjusting the mask shape and height, APS (advanced plasma source) parameters and plate rotation frequency enables one to separately control the amount of momentum transfer for fluorine depletion and for plasma assisted deposition. Relatively speaking, the height of the mask is located above the target 17 and below the plasma 19 as illustrated in FIG. 5. For a specific shaped mask, the higher the mask position, the more fluorine will be depleted at the interface. An adhesive and hermetic film, for example, an $SiO_2$ film, can be deposited on fluoride optics using a "partial mask" as illustrated in FIG. 5 or the "reverse mask" as described in commonly owned U.S. application Ser. No. 11/510,140 instead of a regular mask as commonly used in the industry, and by adjusting APS parameters and rotation frequency one can assure that sufficient ion bombardment of the deposited film is accomplished so that a chemical bond form between the deposited film and the $CaF_2$ optic. The shape of the mask used in practicing the invention is principally determined by the ratio of α/β, which should be between 1 and 4 (1≦α/β≦4). A "regular" mask would have no opening through the mask is directly above the target 17; a reverse mask described in U.S. application Ser. No 11/510,140 would have an opening through the mask. When using a "partial mask" as illustrated in FIG. 5, the ratio of α/β should be in the range of 1-4.

Increased Film Packing Density

As soon as the $CaF_2$ surface is covered by a few nanometers of $SiO_2$ film, for example, 1-5 nm, the deposition process enters a regime of plasma assisted deposition along with in situ plasma smoothing. This process still can be described by Eq. (1), where $P_\alpha$ and $P_\beta$ represent in situ plasma smoothing and plasma assisted deposition, respectively. Based on Eq. (1), the amount of plasma momentum transfer $P_\beta$ applied for film deposition is defined by, $$P_\beta = \left(\frac{\beta}{2\pi R}\kappa\right) J_i \sqrt{2m_i eV_b} \qquad \text{Eq. (2)}$$

Figure 6:
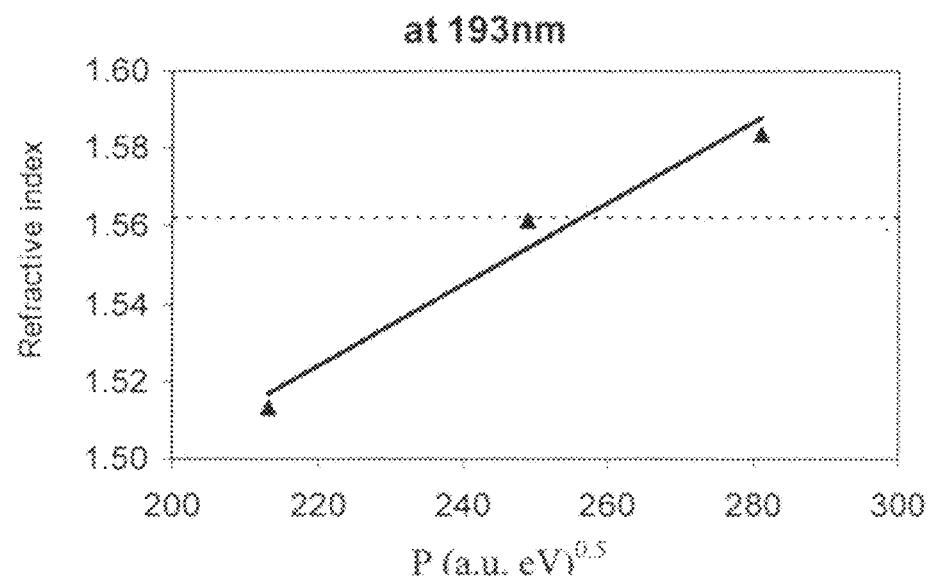
FIG. 6 illustrates the refractive index of a PIAD $SiO_2$ film as a function of plasma momentum transfer.

It has been understood that the refractive index of amorphous $SiO_2$ film is directly correlated to film packing density when a correct stoichiometry is maintained (see J. Wang et al., "*Elastic and plastic relaxation of densified $SiO_2$ films*", Applied Optics, Vol. 47, No. 13, pp C131-C134). FIG. 6 shows the refractive indices (solid line) of a $SiO_2$ film at 193 nm wavelength as a function of plasma momentum transfer $P_\beta$ described in Eq. 2. The refractive index of the bulk fused silica is also plotted in FIG. 6 as a broken line for comparison. With a small amount of plasma bombardment the refractive index of the $SiO_2$ film is lower than the bulk, indicating the film packing density is less than the bulk. Increasing the plasma momentum transfer enables one to produce densified film with a refractive index higher than the bulk material. For $SiO_2$ film, the amount of plasma momentum transfer is 250 (a.u. eV)$^{0.5}$, corresponding to the film packing density close to the bulk. In accordance with the invention, the amount of plasma momentum transfer is further increased to 280 (a.u. eV)$^{0.5}$. As a result, the film packing density is greater than the bulk material, leading to the formation of further densification of $SiO_2$ film.

In situ Plasma Smoothing

Figure 7:
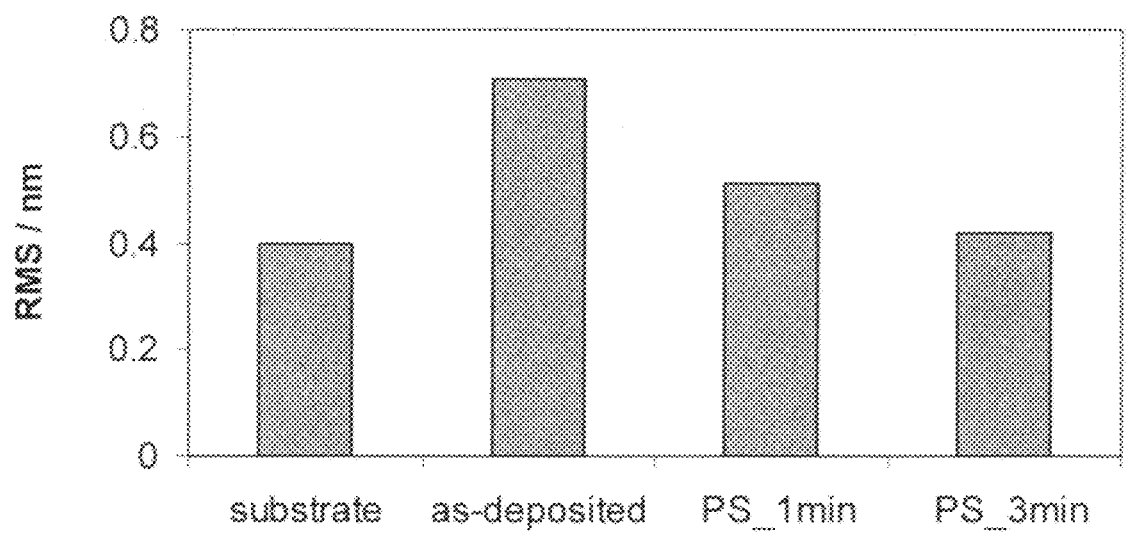
FIG. 7 is an illustration of the plasma smoothing effect on a 60 nm thick $SiO_2$ film deposited via standard PIAD process.
Figure 8A:
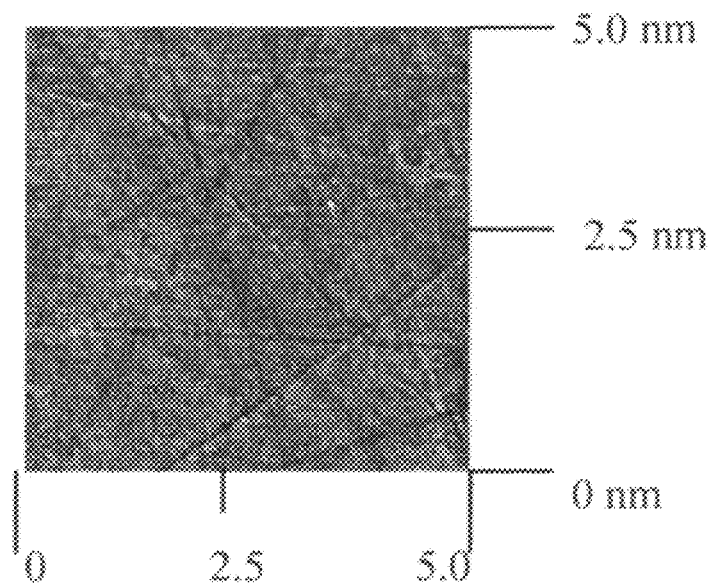
FIG. 8A is an AFM image of PIAD deposited F—$SiO_2$ film with in situ and post-deposition plasma smoothing in accordance with the invention.
Figure 8B:
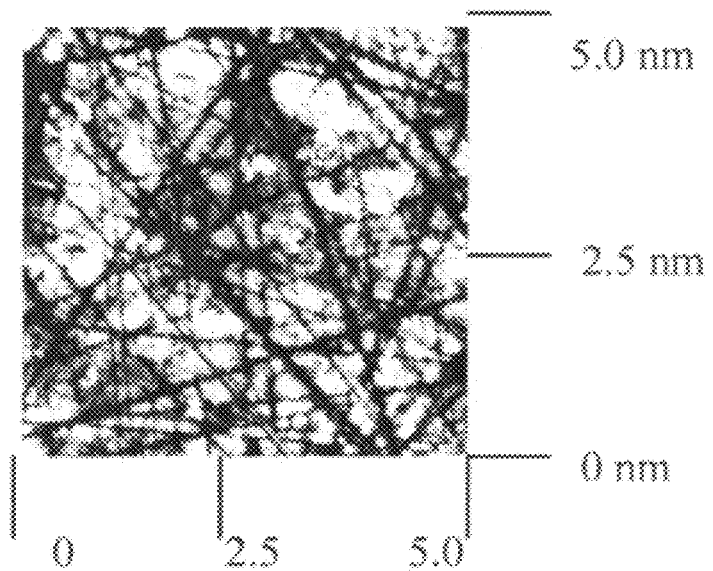
FIG. 8B is an AFM image of PIAD deposited F—$SiO_2$ film without in situ plasma smoothing.

Besides interfacial strength and film packing density, it is also important to eliminate the formation of coating defects and the duplication of substrate surface polish scratches during film deposition process. This goal can be accomplished by introducing plasma smoothing technology. The plasma smoothing effect can be demonstrated by prolonging plasma treatment on a standard PIAD (plasma ion assisted deposition) $SiO_2$ film. FIG. 7 depicts the surface root-mean-square (RMS) roughness variation of 60 nm $SiO_2$ film as a function of plasma treatment. The RMS value was obtained by means of AFM measurement. The RMS of uncoated substrate (labeled "substrate") is 0.40 nm. The surface RMS increases to 0.71 nm after deposition 60 nm $SiO_2$ film (labeled "as-deposited") with standard PIAD process (i.e. $P_\beta$=250 (a.u. eV)$^{0.5}$). One (1) minute of plasma smoothing (labeled as "PS_1 min") reduces the RMS to 0.51 nm, and 3 minutes of plasma smoothing (labeled as "PS_3 min") drops the RMS down to 0.42 nm. FIGS. 8A and 8B shows AFM images of a 60 nm $SiO_2$ layer prior to (FIG. 8B) and after (FIG. 8A) 3 minutes of plasma smoothing. The results suggest that high spatial frequency structure is significantly reduced because of the plasma interacting with the deposited film surface without altering film volume property.

The interaction of plasma with the $SiO_2$ deposited surface continues within zone α where $SiO_2$ vapor flux in the vacuum chamber is blocked by the mask and no deposition occurs. What happens in this area is that plasma smoothing takes place. As schematically illustrated in FIG. 5, the partial mask enables us to integrate the plasma smoothing into the PIAD process and double the functionality of the plasma source; that is, plasma assisted deposition within zone β and in situ plasma smoothing within zone α.

The plasma momentum transfer $P_\alpha$ used for plasma smoothing can be determined by, $$P_\alpha = \left(\frac{\alpha}{2\pi n_s f}\right) J_i \sqrt{2m_i eV_b} \qquad \text{Eq. (3)}$$

where $n_s$ in Eq. (3) is the surface atom density of the deposited film such as $SiO_2$ in atom/cm$^2$ instead of the $CaF_2$ substrate in Eq. (1). This process is called in situ plasma smoothing because the plasma successively interacts with the deposited film surface of every 3~4 atomic layer.

Combining the 3 steps mentioned above, the invention disclosures a new method for depositing adhesive and hermetic oxide films on fluoride optics, i.e., enhancing interfacial adhesive strength by introducing oxygen bridge bonding, increasing $SiO_2$ film packing density by modifying plasma momentum transfer, and reducing coating defects by means of mask technology consequently leading to in situ plasma smoothing. FIG. 8A shows the AFM image of F—$SiO_2$ coated $CaF_2$ optics by using the techniques disclosed by the invention. FIG. 8B shows the AFM image of F—$SiO_2$ coated $CaF_2$ optics by using the standard process for comparison. The impact of substrate polishing residual on film morphology is significantly eliminated (FIG. 8A) as a result of the techniques employed in the invention disclosure, including enhanced interfacial bonding, increased film packing density, and in situ plasma smoothing. The standard coating process, on the other hand, has a weak interfacial bonding, low film packing density, and a high film defect density.

Figure 9A:
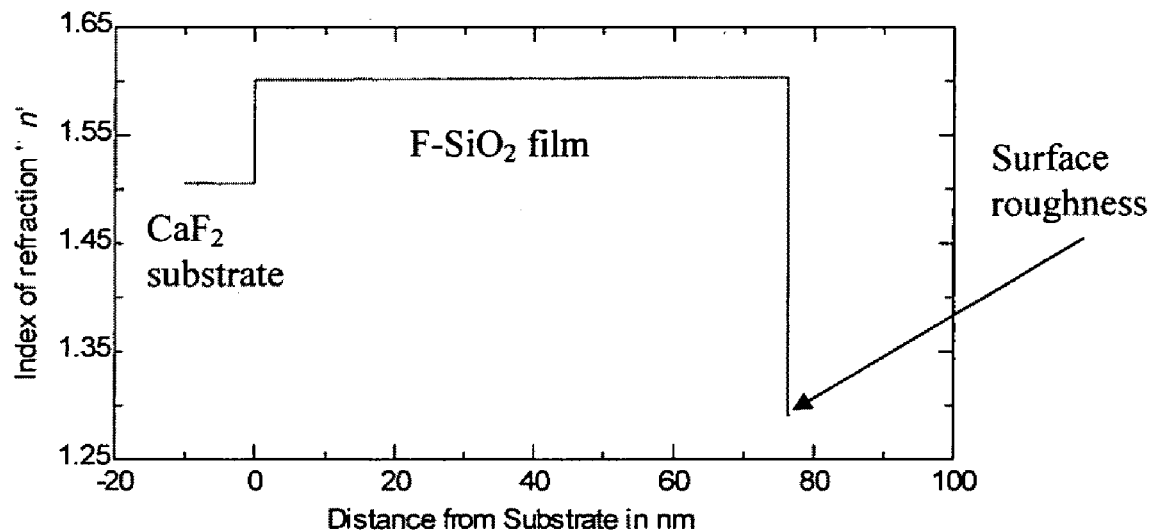
FIG. 9A is an index depth profile of PIAD deposited F—SiO2 films with in situ plasma smoothing.
Figure 9B:
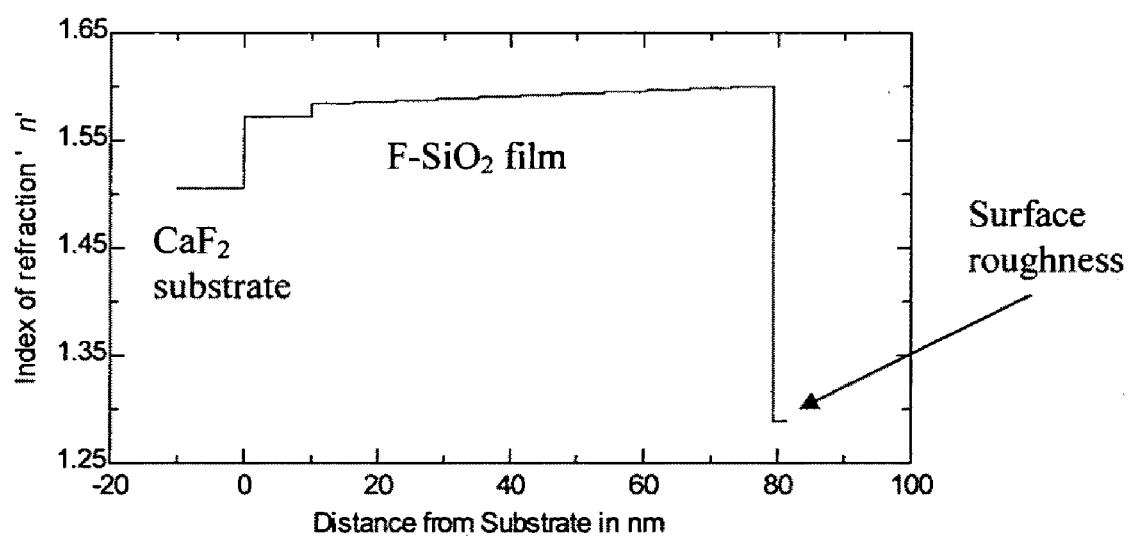
FIG. 9B is an index depth profile PIAD deposited F—$SiO_2$ film without in situ plasma smoothing.

FIGS. 9A and 9B plot index depth profiles of PIAD deposited F—$SiO_2$ films at 193 nm of ArF excimer laser wavelength with and without in situ plasma smoothing. The depth profiles were determined by modeling the ellipsometric data obtained on the films. This approach has been proved to be able to get both film volume and film surface information (Jue Wang et al, "Crystal phase transition of HfO2 films evaporated by plasma-ion-assisted deposition", *Applied Optics*, Vol. 47 No. 13 (2008), pp. C189-C192). The refractive index depth profiles suggest that the plasma smoothed film is a homogeneous with a smooth surface (inhomogeneity<0.1%, rms=0.29 nm) whereas the un-smoothed film is in-homogeneous with a rough surface (inhomogeneity=1.8%, rms=2.17 nm). The modeled surface roughness is consistent with AFM measurement shown in FIGS. 8A and 8B. The weak van der Waals bonding between, for example, a $CaF_2$ window and F—$SiO_2$ film leads to a reduced film refractive index with low packing density at the beginning of the film deposition and a rough surface as shown in FIG. 9B. On the other hand, in accordance with the invention, the chemically bonded interface with addition of in situ plasma smoothing results in a homogeneous dense smooth F—$SiO_2$ coating on $CaF_2$ as shown in FIG. 9A.

Figure 10:
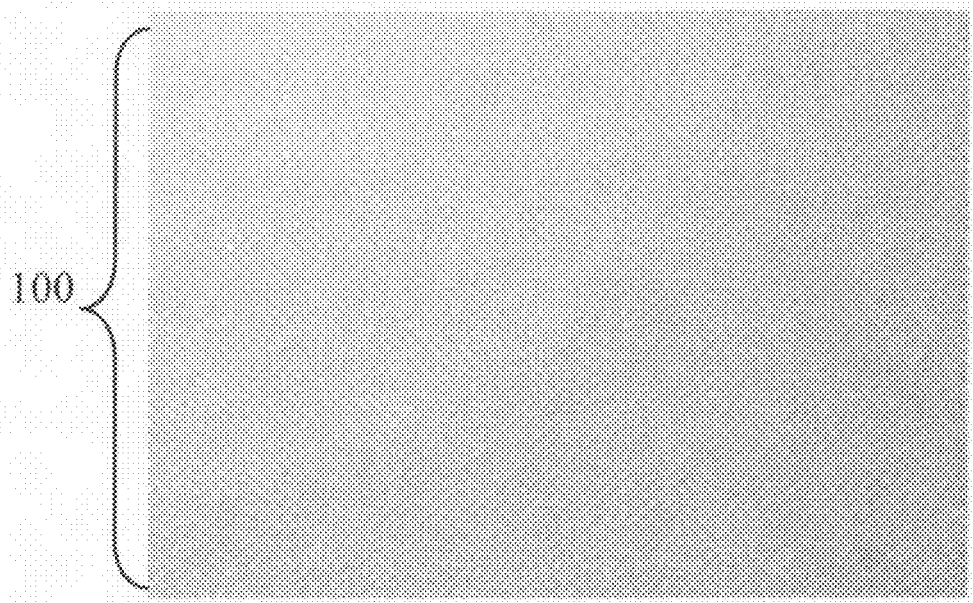
FIG. 10 is an optical image illustrating no premature failure of an adhesive and hermetic F—$SiO_2$ coated $CaF_2$ optics of the invention after 193 nm laser irradiation of 40M pulses at 70 mJ/cm$^2$ and 3 KHz.
Figure 11:
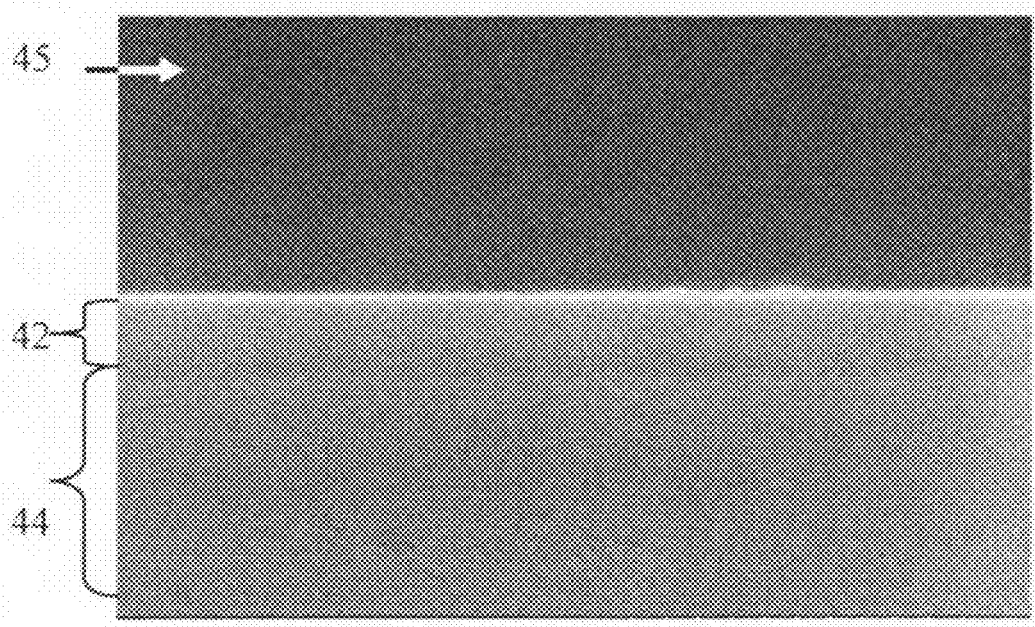
FIG. 11 is a SEM cross-sectional image of an adhesive and hermetic F—$SiO_2$ film deposited on $CaF_2$ optics of the invention after 193 nm laser irradiation of 40M pulses at 70 mJ/cm$^2$ and 3 KHz.

A 76 nm adhesive and hermetic F—$SiO_2$ film was deposited by PIAD at an elevated chamber temperature on $CaF_2$ (111) windows. The PIAD was performed in a commercial cryo-pumped deposition system with an e-gun evaporator (SYRUSpro 1110, Leybold Optics), equipped with an advanced plasma source (APS). The $CaF_2$ windows were super-polished with surface roughness around 0.2 nm in rms. The $CaF_2$ surface was parallel to the (111) plane with an accuracy of ±2°. The deposition system was pumped down to a base pressure of less than 5×10$^{-6}$ mbar. Low energy plasma cleaning was performed at a bias voltage of 50V and an Ar/$O_2$ gas ratio of 1.5 before deposition. High energy reactive plasma with a bias voltage of 140V was used to generate chemically bonded interface, homogeneous dense F—SiO$_2$ film and smoothed surface. The deposition rate was controlled by a quartz monitor at 0.25 nm/s. During deposition the substrate temperature and the center rotation speed of the element holder were kept at 120° C. and 20 rpm, respectively. Oxygen gas was directly introduced into the deposition chamber to establish an interfacial bonding and to maintain the correct stoichiometry of the oxide films, whereas argon was used as a working gas for the plasma source. During deposition, a ratio of α/β and Ar/O$_2$ was maintained at 3 and 2, respectively. Besides standard coating durability tests based on US Military Standard (MIL-M-13508C section 4.4.5_abrasion/4.4.6_adhesion/4.4.7_humidity), a 40M (million) pulse 193 nm laser test was performed at 70 mJ/cm$_2$ and 3 KHz. No premature failure of the F—SiO$_2$ coated CaF$_2$ optics appeared as a result of bubble formation under 193 nm laser irradiation. In comparison to FIGS. 2 and 3, FIGS. 10 and 11 show an optical image and an SEM cross-sectional image illustrating no premature failure, for example, bubble formation, of the F—SiO$_2$ coated CaF$_2$ optics after 193 nm laser irradiation of 40M pulses at 70 mJ/cm$^2$ and 3 KHz in accordance with the invention. FIG. 10 shows no bubbles on the surface of element/substrate 100 as seen in FIG. 2. FIG. 11 shows the background 45, an F—SiO$_2$ film 42 and a CaF$_2$ substrate 44 (optical element). There is no "hump" in FIG. 11 due to coating delamination from the CaF$_2$ surface as is seen in FIG. 3. The white line above the F—SiO$_2$ coating is a reflection artifact produced while taking the SEM photograph as is also seen in FIG. 3 and is not due to any defect in the coating and/or the substrate.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

We claim:

1. A method for making adhesive, hermetic coating on alkaline earth metal fluoride optical elements, the method comprising the steps of:
   providing a vacuum chamber and within said chamber,
   providing an optical element made from a single crystal of an alkaline earth metal fluoride, said element being located on a rotatable plate;
   providing at least one selected coating material source, or a mixture of coating materials source, and vaporizing said material(s) using an e-beam to provide a coating material vapor flux, said flux passing from said material source by a mask having a selected shape to said optical element;
   providing plasma ions from a plasma source;
   rotating said element at a selected rotation frequency f; and
   depositing said coating material on the surface of said optical element as a coating film and bombarding said film on said element with said plasma ions during said material deposition process to thereby form an adhesive, hermetic film on said element;
   wherein:
   said oxide film is chemically bonded to the fluoride surface of said element with a bonding energy ≧4 eV;
   said alkaline earth metal fluoride is selected from the group consisting of MgF$_2$, CaF$_2$, BaF$_2$, SrF$_2$, and mixtures of at least two of said alkaline earth metal fluorides; and
   said mask is selected the group consisting of a partial mask and a reverse mask and the coated surface of the optical element has a surface roughness of less than 1 nm rms.

2. The method according to claim 1, wherein providing an optical element made from a single crystal of an alkaline earth metal fluoride means providing an optical element made from a CaF$_2$ single crystal.

3. The method according to claim 1, wherein providing at least one selected coating material source means providing a material selected from the group consisting of Al$_2$O$_3$, F—Al$_2$O$_3$, SiON, HfO$_2$, Si$_3$N$_4$, TiO$_2$ and ZrO$_2$, and mixtures thereof.

4. The method according to claim 1, wherein providing at least one selected coating material source means providing a material selected from the group consisting of SiO$_2$ and F—SiO$_2$.

5. The method according to claim 1, wherein the rotation frequency f is in the range of 4 to 36 rpm.

6. The method according to claim 1, wherein the rotatable plate has zones α and β, and the shape of the selected mask is determined by the ratio of α/β, which ratio is in the range of 1 to 4.

7. The method according to claim 1, wherein said mask is a partial mask.

8. The method according to claim 1, wherein said optical element is placed on said rotatable plate such that only one side of the optical element is coated with the coating material during the coating method.

9. An optical element having an adhesive, hermetic coating thereon, said element comprising:
   a shaped optical element made of a single crystal alkaline earth metal fluoride material and
   a coating chemically bonded to at least one light transmitting surface of said element, said coating being bonded to said element surface with a bond energy ≧4 eV, wherein the coated surface of the optical element has a surface roughness of less than 1 nm rms.

10. The optical element according to claim 9, wherein said shaped optical element is made from an alkaline earth metal fluoride single crystal material selected from the group consisting of MgF$_2$, CaF$_2$, BaF$_2$, SrF$_2$, and mixtures of at least two of said alkaline earth metal fluorides.

11. The optical element according to claim 9, wherein said shaped optical element is made from CaF$_2$.

12. The optical element according to claim 9, wherein said coating selected from the group consisting of Al$_2$O$_3$, F—Al$_2$O$_3$, SiON, HfO$_2$, Si$_3$N$_4$, TiO$_2$ and ZrO$_2$, and mixtures thereof.

13. The optical element according to claim 9, wherein said coating selected from the group consisting of SiO$_2$ and F—SiO$_2$.

14. The optical element according to claim 9, wherein said coating on said optical element has a thickness in the range of 20 to 200 nm.

15. The optical element according to claim 9, wherein the thickness is in the range of 50 to 150 nm.

16. A method for making adhesive, hermetic coating on CaF$_2$ optical elements, the method comprising the steps of:
   providing a vacuum chamber and within said chamber,
   providing a CaF$_2$ optical element made from a CaF$_2$, single crystal, said element being located on a rotatable plate;
   providing at least one selected coating material source, or a mixture of coating materials source, and vaporizing said material(s) using an e-beam to provide a coating material vapor flux, said flux passing from said material source by a mask having a selected shape to said optical element;

providing plasma ions from a plasma source;
rotating said element at a selected rotation frequency f; and
depositing said coating material on the surface of said optical element as a coating film and bombarding said film on said element with said plasma ions during said material deposition process to thereby form an adhesive, hermetic film on said element;

wherein:

said oxide film is chemically bonded to the fluoride surface of said element with a bonding energy $\geqq 4$ eV;

said mask is selected the group consisting of a partial mask and a reverse mask: and the rotatable plate has zones $\alpha$ and $\beta$ and the shape of the selected mask is determined by the ratio of $\alpha/\beta$, which ratio is in the range of 1 to 4 and the coated surface of the optical element has a surface roughness of less than 1 nm rms.

17. The method according to claim 16, wherein said mask is a partial mask.

18. The method according to claim 16, wherein providing at least one selected coating material source means providing a material selected from the group consisting of $Al_2O_3$, F—$Al_2O_3$, SiON, $HfO_2$, $Si_3N_4$, $TiO_2$ and $ZrO_2$, and mixtures thereof.

19. The method according to claim 16, wherein providing at least one selected coating material source means providing a material selected from the group consisting of $SiO_2$ and F—$SiO_2$.

20. The method according to claim 16, wherein the rotation frequency f is in the range of 4 to 36 rpm.

21. The method according to claim 16, wherein said optical element is placed on said rotatable plate such that only one side of the optical element is coated with the coating material during the coating method.

22. An optical element having an adhesive, hermetic coating thereon, said element comprising:

a shaped optical element made of a $CaF_2$ single crystal and a coating chemically bonded to at least one light transmitting surface of said element, said coating being bonded to said element surface with a bond energy $\geqq 4$ eV;

wherein said coating selected from the group consisting of $SiO_2$, F—$SiO_2$, $Al_2O_3$, F—$Al_2O_3$, SiON, $HfO_2$, $Si_3N_4$, $TiO_2$ and $ZrO_2$, and mixtures thereof, and wherein the coated surface inhomogeneity of the optical element is less than 1 percent.

23. The optical element according to claim 22, wherein said coating selected from the group consisting of $SiO_2$ and F—$SiO_2$.

24. The optical element according to claim 22, wherein said coating on said optical element has a thickness in the range of 20 to 200 nm.

25. The optical element according to claim 22, wherein the thickness is in the range of 50 to 150 nm.

* * * * *